(12) United States Patent
Mei

(10) Patent No.: US 11,978,840 B2
(45) Date of Patent: May 7, 2024

(54) MICRO LIGHT EMITTING DIODE DISPLAY PANEL, MANUFACTURING METHOD THEREOF AND DISPLAY DEVICE

(71) Applicant: Shenzhen China Star Optoelectronics Semiconductor Display Technology Co., Ltd., Guangdong (CN)

(72) Inventor: Xueru Mei, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/438,953

(22) PCT Filed: Jul. 23, 2021

(86) PCT No.: PCT/CN2021/108281
§ 371 (c)(1),
(2) Date: Sep. 14, 2021

(87) PCT Pub. No.: WO2023/283999
PCT Pub. Date: Jan. 19, 2023

(65) Prior Publication Data
US 2024/0030393 A1    Jan. 25, 2024

(30) Foreign Application Priority Data
Jul. 14, 2021 (CN) .......................... 202110797246.6

(51) Int. Cl.
*H01L 33/62* (2010.01)
*H01L 23/00* (2006.01)
*H01L 25/16* (2023.01)

(52) U.S. Cl.
CPC .............. *H01L 33/62* (2013.01); *H01L 24/05* (2013.01); *H01L 24/29* (2013.01); *H01L 24/32* (2013.01);
(Continued)

(58) Field of Classification Search
CPC ......... H01L 33/62; H01L 24/05; H01L 24/29; H01L 24/32; H01L 25/167;
(Continued)

(56) References Cited

U.S. PATENT DOCUMENTS

2020/0013841 A1 * 1/2020 Lee .................. H01L 25/167
2021/0202452 A1 * 7/2021 Kim .................. H01L 24/24

FOREIGN PATENT DOCUMENTS

| CN | 110190085 | 8/2019 |
| CN | 110690244 | 1/2020 |

(Continued)

*Primary Examiner* — Douglas W Owens

(57) ABSTRACT

Disclosed are a micro light emitting diode display panel, a manufacturing method thereof and a display device. The embodiment micro light emitting diode display panel includes a first metal layer and a second metal layer; the first metal layer includes a source electrode, a drain electrode and a power line; the second metal layer includes a first bonding electrode and a second bonding electrode, and the first bonding electrode is electrically connected to the source electrode through the first via hole, and the second bonding electrode is electrically connected to the power line through the second via hole; the first via hole and the second via hole are both provided with a supporting column.

20 Claims, 3 Drawing Sheets

(52) U.S. Cl.
CPC .. *H01L 25/167* (2013.01); *H01L 2224/13016* (2013.01); *H01L 2224/13021* (2013.01); *H01L 2224/29016* (2013.01); *H01L 2224/29028* (2013.01); *H01L 2224/32145* (2013.01); *H01L 2924/12041* (2013.01); *H01L 2933/0066* (2013.01)

(58) Field of Classification Search
CPC . H01L 2224/13016; H01L 2224/13021; H01L 2224/29016; H01L 2224/29028; H01L 2224/32145; H01L 2924/12041; H01L 2933/0066
See application file for complete search history.

(56) References Cited

FOREIGN PATENT DOCUMENTS

| | | |
|---|---|---|
| CN | 112599651 | 4/2021 |
| WO | WO 2020/238100 | 12/2020 |
| WO | WO 2021/108951 | 6/2021 |

* cited by examiner

MICRO LIGHT EMITTING DIODE DISPLAY PANEL, MANUFACTURING METHOD THEREOF AND DISPLAY DEVICE

RELATED APPLICATIONS

This application is a National Phase of PCT Patent Application No. PCT/CN2021/108281 having International filing date of Jul. 23, 2021, which claims the benefit of priority of Chinese Patent Application No. 202110797246.6 filed on Jul. 14, 2021. The contents of the above applications are all incorporated by reference as if fully set forth herein in their entirety.

FIELD AND BACKGROUND OF THE INVENTION

The present application relates to a display technology field, and more particularly to a micro light emitting diode display panel, a manufacturing method thereof and a display device.

In recent years, OLED (Organic Light Emitting Diode) display technology and MLED (Mini/Micro Light Emitting Diode) display technology, such new display technologies have enter a high-speed development stage. Compared with the traditional LCD (Liquid Crystal Display) display technology, OLED and MLED possess display advantages, such as low power consumption, high color gamut and high brightness.

In MLED display technology, it involves TFT (Thin Film Transistor) backplane technology and back-end MLED chip transferring technology. In the transferring process, ACF (Anisotropic Conductive Film) is generally used to transfer the MLED chip to be attached on the bonding electrode on the TFT backplane. However, the ACF needs to be squeezed on the entire surface, so that the conductive gold balls in the ACF are gathered, so as to achieve the electrical connection between the MLED chips and the TFT backplane. However, due to the flatness of the machine and the low position of the bonding electrode of the MLED chips in the plane, it is easy to cause a short circuit between the bonding electrode and the in-plane wiring, which may also cause poor ACF conductivity to affect product yield. Therefore, there is a need to improve this defect.

SUMMARY OF THE INVENTION

The present application provides a micro light emitting diode display panel, which is employed to solve the technical issue that due to the in-plane low position of the bonding electrode of the micro light emitting diode chip in the micro light emitting diode display panel of the prior art, it is easy to cause a short circuit of the bonding electrode and the in-plane wiring, and to cause the poor ACF conductivity during the transferring process to affect product yield.

The embodiment of the present application provides a micro light emitting diode display panel, including a substrate, a first metal layer, a passivation layer and a second metal layer; the first metal layer is positioned on the substrate and includes a source electrode, a drain electrode and a power line; the passivation layer is positioned on the first metal layer and includes a first via hole on the source electrode and a second via hole on the power line; and the second metal layer is positioned on the passivation layer and includes a first bonding electrode and a second bonding electrode, and the first bonding electrode is electrically connected to the source electrode through the first via hole, and the second bonding electrode is electrically connected to the power line through the second via hole; wherein the first via hole and the second via hole are both provided with a supporting column.

In the micro light emitting diode display panel provided by the embodiment of the present application, the micro light emitting diode display panel further includes a micro light emitting diode chip, and the micro light emitting diode chip is electrically connected to the first bonding electrode and the second bonding electrode through an anisotropic conductive adhesive film, respectively.

In the micro light emitting diode display panel provided by the embodiment of the present application, heights of the supporting columns are greater than or equal to 3 micrometers and less than or equal to 10 micrometers.

In the micro light emitting diode display panel provided by the embodiment of the present application, the heights of the supporting columns are equal.

In the micro light emitting diode display panel provided by the embodiment of the present application, a material of the supporting columns is an organic photoresist material.

In the micro light emitting diode display panel provided by the embodiment of the present application, cross-sectional shapes of the supporting columns are rectangular or circular.

In the micro light emitting diode display panel provided by the embodiment of the present application, longitudinal cross-sectional shapes of the supporting columns are rectangular or trapezoidal.

In the micro light emitting diode display panel provided by the embodiment of the present application, the two supporting columns positioned in the first via hole and the second via hole, which are adjacent, constitute a support portion, and the support portions are distributed at equal intervals.

In the micro light emitting diode display panel provided by the embodiment of the present application, a thickness of the micro light emitting diode chip is greater than or equal to 4 micrometers and less than or equal to 8 micrometers.

In the micro light emitting diode display panel provided by the embodiment of the present application, a thickness of the anisotropic conductive adhesive film is greater than or equal to 4 micrometers and less than or equal to 8 micrometers.

In the micro light emitting diode display panel provided by the embodiment of the present application, the thickness of the anisotropic conductive adhesive film is equal to the thickness of the micro light emitting diode chip.

The embodiment of the present application provides a manufacturing method of a micro light emitting diode display panel, including steps of: providing a substrate; preparing and patterning a first metal layer on the substrate to form a source electrode, a drain electrode and a power line; preparing and etching a passivation layer on the first metal layer to form a first via hole and a second via hole, and the first via hole is positioned on the source electrode and the second via hole is positioned on the power line; preparing a supporting column in the first via hole and a supporting column in the second via hole; and preparing and patterning a second metal layer on the passivation layer to form a first bonding electrode and a second bonding electrode, and the first bonding electrode is electrically connected to the source electrode through the first via hole, and the second bonding electrode is electrically connected to the power line through the second via hole.

In the manufacturing method of the micro light emitting diode display panel provided by the embodiment of the present application, the manufacturing method further includes a step: bonding a micro light emitting diode chip on the second metal layer, and the micro light emitting diode chip is electrically connected to the first bonding electrode and the second bonding electrode through an anisotropic conductive adhesive film, respectively.

In the manufacturing method of the micro light emitting diode display panel provided by the embodiment of the present application, heights of the supporting columns are greater than or equal to 3 micrometers and less than or equal to 10 micrometers.

In the manufacturing method of the micro light emitting diode display panel provided by the embodiment of the present application, a material of the supporting columns is an organic photoresist material.

The embodiment of the present application further provides a display device, including a micro light emitting diode display panel and a cover plate, and the micro light emitting diode display panel includes a substrate, a first metal layer, a passivation layer and a second metal layer; a first metal layer, being positioned on the substrate and including a source electrode, a drain electrode and a power line; a passivation layer, being positioned on the first metal layer and including a first via hole on the source electrode and a second via hole on the power line; and a second metal layer, being positioned on the passivation layer and including a first bonding electrode and a second bonding electrode, and the first bonding electrode is electrically connected to the source electrode through the first via hole, and the second bonding electrode is electrically connected to the power line through the second via hole; wherein the first via hole and the second via hole are both provided with a supporting column.

In the display device provided by the embodiment of the present application, the micro light emitting diode display panel further includes a micro light emitting diode chip, and the micro light emitting diode chip is electrically connected to the first bonding electrode and the second bonding electrode through an anisotropic conductive adhesive film, respectively.

In the display device provided by the embodiment of the present application, cross-sectional shapes of the supporting columns are rectangular or circular.

In the display device provided by the embodiment of the present application, longitudinal cross-sectional shapes of the supporting columns are rectangular or trapezoidal.

In the display device provided by the embodiment of the present application, the two supporting columns positioned in the first via hole and the second via hole, which are adjacent, constitute a support portion, and the support portions are distributed at equal intervals.

The present application provides a micro light emitting diode display panel, including a substrate, a first metal layer, a passivation layer and a second metal layer; a first metal layer, being positioned on the substrate and including a source electrode, a drain electrode and a power line; a passivation layer, being positioned on the first metal layer and including a first via hole on the source electrode and a second via hole on the power line; and a second metal layer, being positioned on the passivation layer and including a first bonding electrode and a second bonding electrode, and the first bonding electrode is electrically connected to the source electrode through the first via hole, and the second bonding electrode is electrically connected to the power line through the second via hole; wherein the first via hole and the second via hole are both provided with a supporting column. In the present application, the first via hole and the second via hole are arranged in the passivation layer, and then the supporting columns are arranged in the first via hole and the second via hole, and then the first bonding electrode and the second bonding electrode are arranged on the supporting columns. The heights of the first bonding electrode and the second bonding electrode are increased by the supporting columns. When the transferring process is performed, the transferring machine only contacts the anisotropic conductive adhesive films on the first bonding electrode and the second bonding electrode to avoid thermal pressing short circuit in other positions in the plane, thereby improving the transferring yield of the micro light emitting diode chips.

DETAILED DESCRIPTION OF SPECIFIC EMBODIMENTS OF THE INVENTION

Figure 1:
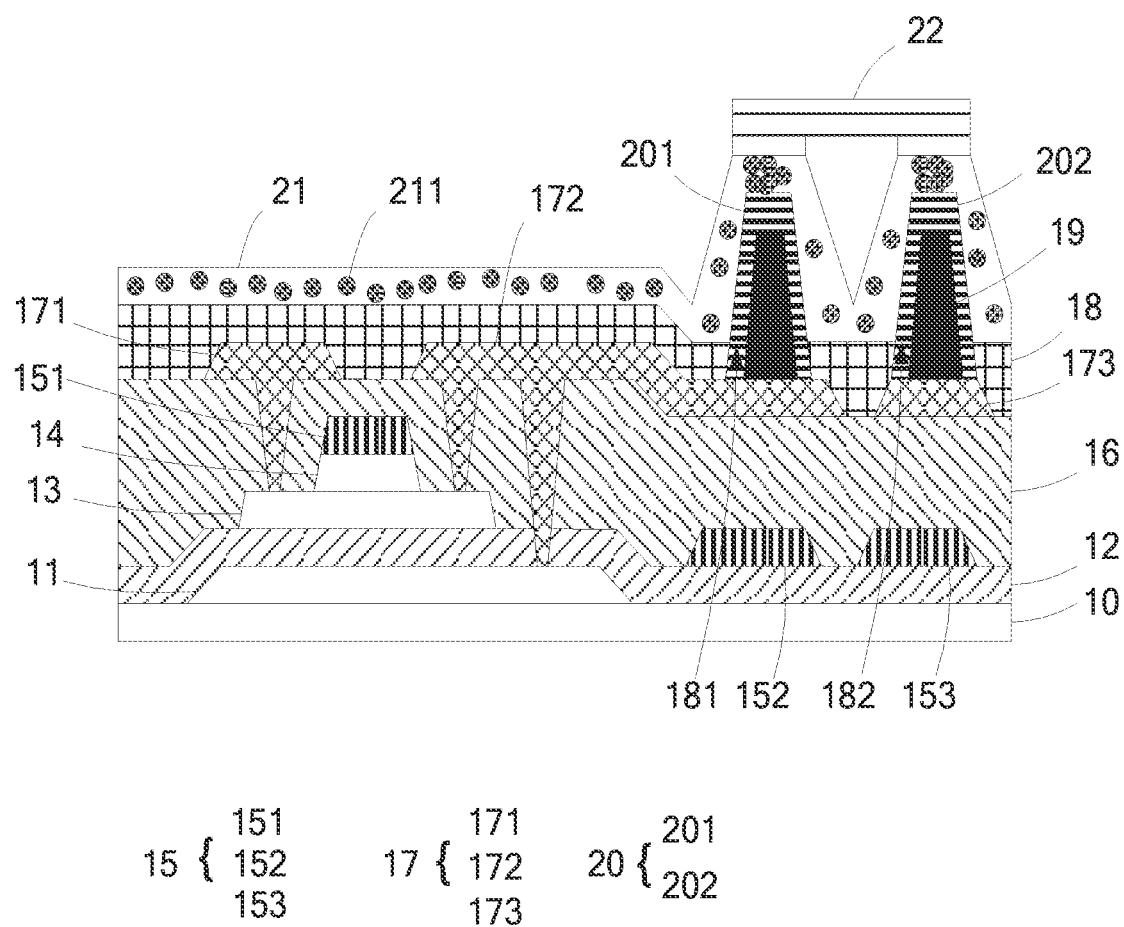
FIG. 1 is a basic structural diagram of a micro light emitting diode display panel provided by an embodiment of the present application.

For the purpose, technical solutions and advantages of the present application will become clear, unambiguous, embodiments of the present application is described in further detail below with reference to the accompanying drawings simultaneously. In drawings, for clarity and ease of understanding and description, the sizes and the thicknesses of the components shown in the drawings are not to scale.

As shown in FIG. 1, which is a basic structural diagram of a micro light emitting diode display panel provided by an embodiment of the present application, the micro light emitting diode display panel includes a substrate 10, a first metal layer 17, a passivation layer 18 and a second metal layer 20; the first metal layer 17 is positioned on the substrate 10 and includes a source electrode 172, a drain electrode 171 and a power line 173; the passivation layer 18 is positioned on the first metal layer 17 and includes a first via hole 181 on the source electrode 172 and a second via hole 182 on the power line 173; and the second metal layer 20 is positioned on the passivation layer 18 and includes a first bonding electrode 201 and a second bonding electrode 202, and the first bonding electrode 201 is electrically connected to the source electrode 172 through the first via hole 181, and the second bonding electrode 201 is electrically connected to the power line 173 through the second via hole 182; wherein the first via hole 181 and the second via hole 182 are both provided with a supporting column 19.

The micro light emitting diode display panel further includes a micro light emitting diode chip 22, and the micro light emitting diode chip 22 is electrically connected to the first bonding electrode 201 and the second bonding electrode 202 through an anisotropic conductive adhesive film 21, respectively.

It is understandable that the micro light emitting diode display panel refers to the provision of multiple micro light emitting diode chips 22 (only one micro light emitting diode chip 22 is shown in FIG. 1 as an example for illustration), and the multiple micro light emitting diode chips 22 are directly driven through the TFT backplane to emit light to display images. Compared with the liquid crystal display panel, the backlight module, the liquid crystal layer and the color film substrate are omitted, which is not only lighter and thinner, but also has high luminous efficiency and high brightness. However, the micro light emitting diode chips 22 of the micro light emitting diode display panel needs the transferring process to be electrically connected to the TFT backplane. The micro light emitting diode chip 22 is adhered to the first bonding electrode 201 and the second bonding electrode 202 of the micro light emitting diode chip on the TFT backplane through the anisotropic conductive adhesive film 21. The anisotropic conductive adhesive film 21 is attached to the entire surface. By squeezing the anisotropic conductive adhesive film 21, the conductive gold balls 211 in the anisotropic conductive adhesive film 21 are gathered, thereby generating a conductive channel. Then, the electrical signal on the TFT backplane is transmitted to the micro light emitting diode chip 22 through the conductive channel, so that the micro light emitting diode chip 22 emits light according to the corresponding driving voltage.

Due to the in-plane low position of the bonding electrode of the micro light emitting diode chip in the micro light emitting diode display panel of the prior art, when squeezing the anisotropic conductive adhesive film, the machine does not only contact the anisotropic conductive adhesive film at the bonding electrode but also contacts other locations that do not need to bond the micro light emitting diode chip. Because the machine is not flat, it is easy to cause short circuit of other metal traces in the plane (such as the positive electrode of the power line, the data line or the area where there is a cross line) during the thermal pressing process, and it may also cause the short circuit between the two bonding electrodes of the micro light emitting diode chip, which makes a low transferring yield of the micro light emitting diode chips and leads to an increase in production cost. In the present application, the supporting columns 19 are provided under the first bonding electrode 201 and the second bonding electrode 202, and the supporting columns 19 can increase the heights of the first bonding electrode 201 and the second bonding electrode 202, so that there is a certain height difference between the first bonding electrode 201, the second bonding electrode 202 and other areas of the micro light emitting diode display panel. When the thermal pressing process is performed, the machine only contacts the anisotropic conductive adhesive film 21 on the first bonding electrode 201 and the second bonding electrode 202. Moreover, it does not contact with other areas where the micro light emitting diode chip 22 does not need to be bound, and will not cause short circuit of other metal traces in the plane. Moreover, it does not contact with the anisotropic conductive adhesive film 21 on the side surfaces of the first bonding electrode 201 and the second bonding electrode 202, and will not cause the short circuit between the first bonding electrode 201 and the second bonding electrode 202. Accordingly, the transferring yield of the micro light emitting diode chips 22 is greatly improved.

Specifically, the cross-sectional area of the support column 19 is smaller than the cross-sectional area of the first via hole 181 and the cross-sectional area of the second via hole 182, respectively, i.e., the outer wall of the support column 19 has no contact with the inner walls of the first via hole 181 and the second via hole 182, so that when the first bonding electrode 201 and the second bonding electrode 202 are subsequently prepared, the first bonding electrode 201 can pass through the gap between the support column 19 and the first via hole 181 to be electrically connected to the source electrode 172 below, and the second bonding electrode 202 can pass through the gap between the support column 19 and the second via hole 182 to be electrically connected to the power line 173 below.

In one embodiment, the heights of the supporting columns 19 are greater than or equal to 3 micrometers and less than or equal to 10 micrometers. It is understandable that when the heights of the supporting columns 19 are between 3 micrometers and 10 micrometers, it is possible to have a certain height difference between the first bonding electrode 201, the second bonding electrode 202 and the passivation layer 18, avoiding thermal pressing short circuit, and the extra height difference can just be provided with a light shielding layer (not shown) to prevent crosstalk of the light color between adjacent micro light emitting diode chips 22, and can also shield the active layer 13 below, which not only improves the contrast but also prevents the active layer 13 of the TFT backplane from being affected by light from causing the threshold voltage to be unstable.

In one embodiment, the heights of the supporting columns 19 are equal. It is understandable that the supporting columns are respectively used to support the first bonding electrode 201 and the second bonding electrode 202. When the heights of the supporting columns 19 are equal, the height of the first bonding electrode 201 and the height of the second bonding electrode 202 are also equal. When the micro light emitting diode chip 22 is transferred, the squeezing force received is relatively uniform, so as to avoid poor conductivity of the anisotropic conductive adhesive film 21 caused by uneven squeezing force.

In one embodiment, a material of the supporting columns 19 is an organic photoresist material. Specifically, the supporting columns 19 can be exposed and developed through a mask to form a corresponding pattern.

In one embodiment, the cross-sectional shapes of the supporting columns 19 are rectangular or circular and the longitudinal cross-sectional shapes of the supporting columns 19 are rectangular or trapezoidal. Specifically, FIG. 1 only shows the longitudinal cross-sectional shape of the supporting columns 19 as a trapezoid as an example for description, and other shapes are not shown. In can be understood that when the cross-sectional shape of the supporting column 19 is rectangular and the longitudinal cross-sectional shape is rectangular, the supporting column 19 as a whole is a quadrangular prism; when the cross-sectional shape of the supporting column 19 is rectangular and the longitudinal cross-sectional shape is trapezoidal, the supporting column 19 as a whole is a quadrangular pyramid; when the cross-sectional shape of the supporting column 19 is circular and the longitudinal cross-sectional shape is rectangular, the supporting column 19 as a whole is a cylinder; when the cross-sectional shape of the supporting column 19 is a circle and the longitudinal cross-sectional shape is a trapezoid, the supporting column 19 as a whole is a truncated cone.

Figure 2:
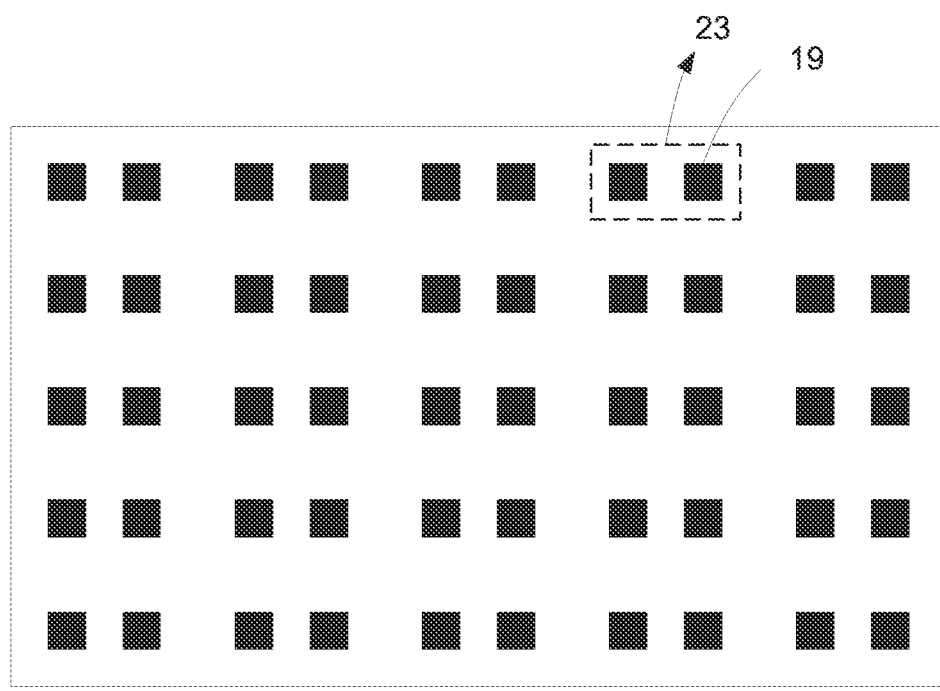
FIG. 2 is a top view diagram of an arrangement of supporting columns provided by an embodiment of the present application.

In one embodiment, the two supporting columns 19 positioned in the first via hole 181 and the second via hole 182, which are adjacent, constitute a support portion 23 (as shown in FIG. 2), and the support portions 23 are distributed at equal intervals. Specifically, refer to FIG. 2, which is a top view diagram of an arrangement of supporting columns provided by an embodiment of the present application. In can be understood that one micro light emitting diode chip 22 (as shown in FIG. 1) corresponds to two adjacent supporting columns 19, i.e., corresponds to one support portion 23. In the embodiment of the present application, the supporting portions 23 are arranged at equal intervals, i.e., the micro light emitting diode chips 22 are also distributed at equal intervals, so that the light emission is more uniform, and the display effect of the micro light emitting diode display panel is improved.

Continue to refer to FIG. 1, in one embodiment, a thickness of the micro light emitting diode chip 22 is greater than or equal to 4 micrometers and less than or equal to 8 micrometers. The thickness of the anisotropic conductive adhesive film 21 is greater than or equal to 4 micrometers and less than or equal to 8 micrometers. The thickness of the anisotropic conductive adhesive film 21 is equal to the thickness of the micro light emitting diode chip 22. Specifically, both the thickness of the anisotropic conductive adhesive film 21 and the thickness of the micro light emitting diode chip 22 are 6 micrometers for instance. In can be understood that when the thickness of the anisotropic conductive adhesive film 21 is equal to the thickness of the micro light emitting diode chip 22, since the support columns 19 are further provided under the micro light emitting diode chip 22, no matter whether the micro light emitting diode chip 22 is completely trapped in the anisotropic conductive adhesive film 21 after thermal pressing, the height of the micro light emitting diode chip 22 is higher than the height of other areas where the support column 19 is not provided, so as to avoid thermal pressing short circuit in other positions in the plane, thereby improving the transferring yield of the micro light emitting diode chip 22.

In one embodiment, the micro light emitting diode display panel further includes a light shielding metal layer 11 on the substrate 10, a buffer layer 12 on the light shielding metal layer 11, an active layer 13 on the buffer layer 12, a gate insulating layer 14 on the active layer 13, a third metal layer 15 on the gate insulating layer 14 and the buffer layer 12 and an interlayer insulating layer 16 on the third metal layer 15. The third metal layer 15 includes a gate electrode 151 on the gate insulating layer 14 and gate lines 152 and 153 on the buffer layer 12.

Figure 3:
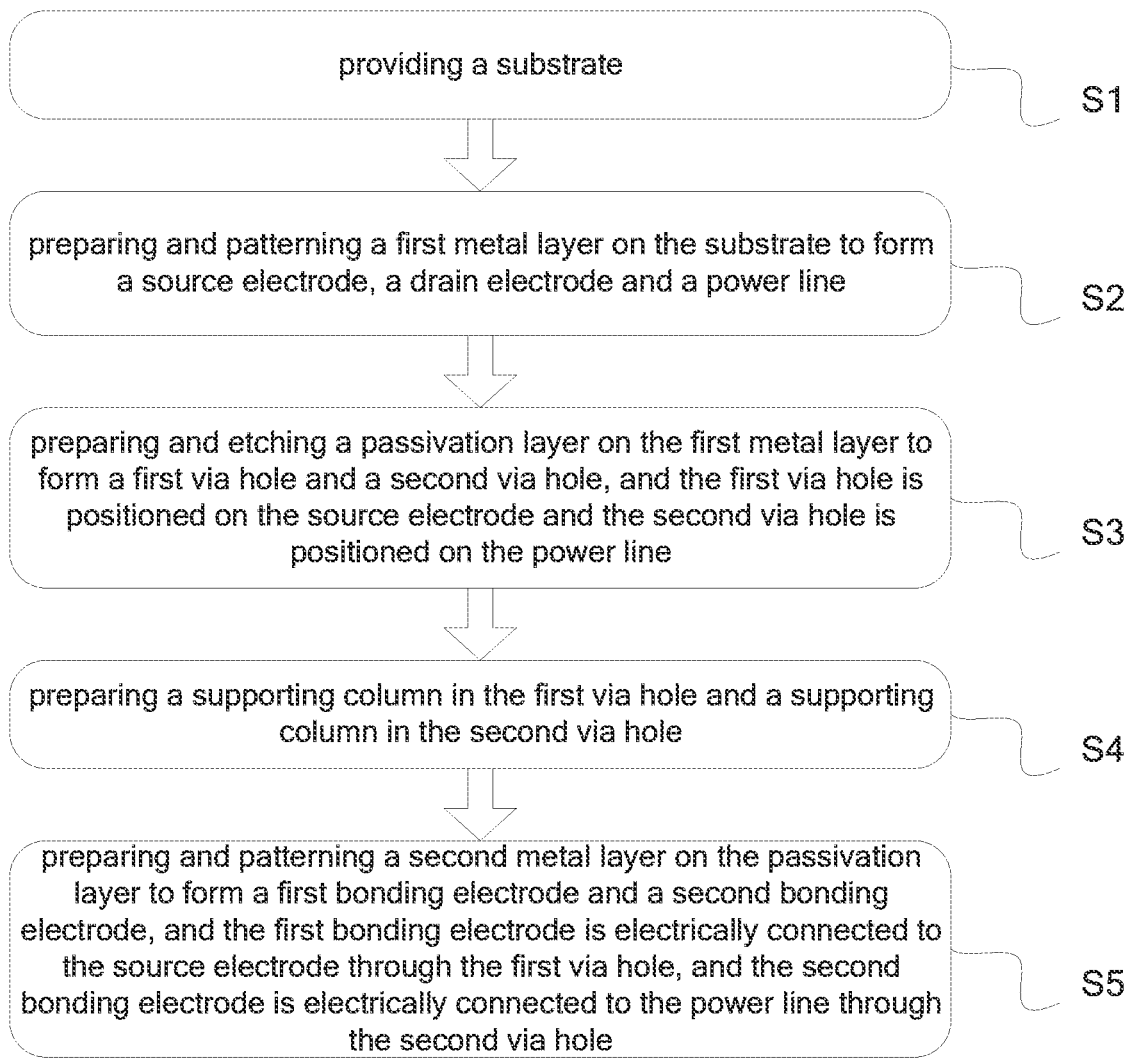
FIG. 3 is a flow chart of a manufacturing method of a micro light emitting diode display panel provided by an embodiment of the present application.

Next, refer to FIG. 3, which is a flow chart of a manufacturing method of a micro light emitting diode display panel provided by an embodiment of the present application. The manufacturing method includes steps of:

S1, providing a substrate;

S2, preparing and patterning a first metal layer on the substrate to form a source electrode, a drain electrode and a power line;

S3, preparing and etching a passivation layer on the first metal layer to form a first via hole and a second via hole, and the first via hole is positioned on the source electrode and the second via hole is positioned on the power line;

S4, preparing a supporting column in the first via hole and a supporting column in the second via hole; and S5, preparing and patterning a second metal layer on the passivation layer to form a first bonding electrode and a second bonding electrode, and the first bonding electrode is electrically connected to the source electrode through the first via hole, and the second bonding electrode is electrically connected to the power line through the second via hole.

Specifically, the cross-sectional area of the support column is smaller than the cross-sectional area of the first via hole and the cross-sectional area of the second via hole, respectively, i.e., the outer wall of the support column has no contact with the inner walls of the first via hole and the second via hole, so that when the first bonding electrode and the second bonding electrode are subsequently prepared, the first bonding electrode can pass through the gap between the support column and the first via hole to be electrically connected to the source electrode below, and the second bonding electrode can pass through the gap between the support column and the second via hole to be electrically connected to the power line below.

The manufacturing method further includes a step of: bonding a micro light emitting diode chip on the second metal layer, and the micro light emitting diode chip is electrically connected to the first bonding electrode and the second bonding electrode through an anisotropic conductive adhesive film, respectively. Specifically, the micro light emitting diode chips needs the transferring process to be electrically connected to the TFT backplane. The micro light emitting diode chip is adhered to the first bonding electrode and the second bonding electrode on the TFT backplane through the anisotropic conductive adhesive film. The anisotropic conductive adhesive film is attached to the entire surface. By squeezing the anisotropic conductive adhesive film, the conductive gold balls in the anisotropic conductive adhesive film are gathered, thereby generating a conductive channel. Then, the electrical signal on the TFT backplane is transmitted to the micro light emitting diode chip through the conductive channel, so that the micro light emitting diode chip emits light according to the corresponding driving voltage.

It is understandable that in the present application, the supporting columns are prepared in the first via hole and the second via hole, and the supporting columns can increase the heights of the first bonding electrode and the second bonding electrode, so that there is a certain height difference between the first bonding electrode, the second bonding electrode and other areas of the micro light emitting diode display panel. When the thermal pressing process is performed, the machine only contacts the anisotropic conductive adhesive film on the first bonding electrode and the second bonding electrode. Moreover, it does not contact with other areas where the micro light emitting diode chip does not need to be bound, and will not cause short circuit of other metal traces in the plane. Moreover, it does not contact with the anisotropic conductive adhesive film on the side surfaces of the first bonding electrode and the second bonding electrode, and will not cause the short circuit between the first bonding electrode and the second bonding electrode. Accordingly, the transferring yield of the micro light emitting diode chips is greatly improved.

In one embodiment, the heights of the supporting columns are greater than or equal to 3 micrometers and less than or equal to 10 micrometers. It is understandable that when the heights of the supporting columns are between 3 micrometers and 10 micrometers, it is possible to have a certain height difference between the first bonding electrode, the second bonding electrode and the passivation layer, avoiding thermal pressing short circuit, and the extra height difference can just be provided with a light shielding layer to prevent crosstalk of the light color between adjacent micro light emitting diode chips.

In one embodiment, the heights of the supporting columns are equal. It is understandable that the supporting columns are respectively used to support the first bonding electrode and the second bonding electrode. When the heights of the supporting columns are equal, the height of the first bonding electrode and the height of the second bonding electrode are also equal. When the micro light emitting diode chip is transferred, the squeezing force received is relatively uniform, so as to avoid poor conductivity of the anisotropic conductive adhesive film caused by uneven squeezing force.

In one embodiment, a material of the supporting columns is an organic photoresist material. Specifically, the supporting columns can be exposed and developed through a mask to form a corresponding pattern.

In one embodiment, cross-sectional shapes of the supporting columns are rectangular or circular and longitudinal cross-sectional shapes of the supporting columns are rectangular or trapezoidal. In can be understood that when the cross-sectional shape of the supporting column is rectangular and the longitudinal cross-sectional shape is rectangular, the supporting column as a whole is a quadrangular prism; when the cross-sectional shape of the supporting column is rectangular and the longitudinal cross-sectional shape is trapezoidal, the supporting column as a whole is a quadrangular pyramid; when the cross-sectional shape of the supporting column is circular and the longitudinal cross-sectional shape is rectangular, the supporting column as a whole is a cylinder; when the cross-sectional shape of the supporting column is a circle and the longitudinal cross-sectional shape is a trapezoid, the supporting column as a whole is a truncated cone.

In one embodiment, the two supporting columns positioned in the first via hole and the second via hole, which are adjacent, constitute a support portion, and the support portions are distributed at equal intervals. In can be understood that one micro light emitting diode chip corresponds to two adjacent supporting columns, i.e., corresponds to one support portion. In the embodiment of the present application, the supporting portions are arranged at equal intervals, i.e., the micro light emitting diode chips are also distributed at equal intervals, so that the light emission is more uniform, and the display effect of the micro light emitting diode display panel is improved.

In one embodiment, a thickness of the micro light emitting diode chip is greater than or equal to 4 micrometers and less than or equal to 8 micrometers. A thickness of the anisotropic conductive adhesive film is greater than or equal to 4 micrometers and less than or equal to 8 micrometers. The thickness of the anisotropic conductive adhesive film is equal to the thickness of the micro light emitting diode chip. Specifically, both the thickness of the anisotropic conductive adhesive film and the thickness of the micro light emitting diode chip are 6 micrometers for instance. In can be understood that when the thickness of the anisotropic conductive adhesive film is equal to the thickness of the micro light emitting diode chip, since the support columns are further provided under the micro light emitting diode chip, no matter whether the micro light emitting diode chip is completely trapped in the anisotropic conductive adhesive film after thermal pressing, the height of the micro light emitting diode chip is higher than the height of other areas where the support column is not provided, so as to avoid thermal pressing short circuit in other positions in the plane, thereby improving the transferring yield of the micro light emitting diode chip.

In one embodiment, the manufacturing method further includes steps between Step S1 and Step S2: preparing a light shielding metal layer on the substrate; preparing a buffer layer on the light shielding metal layer; preparing an active layer on the buffer layer; preparing a gate insulating layer on the active layer; preparing and patterning a third metal layer on the gate insulating layer and the buffer layer to form a gate electrode on the gate insulating layer and gate lines on the buffer layer; preparing an interlayer insulating layer on the third metal layer.

The embodiment of the present application further provides a display device, including a micro light emitting diode display panel and a cover plate. Please refer to FIG. 1 to FIG. 3 and related descriptions for the structure and manufacturing method of the micro light emitting diode display panel, which will not be repeated here. The display device provided by the embodiment of the present application may be a product or component with a display function, such as a mobile phone, a tablet computer, a notebook computer, a digital camera and a navigator.

In conclusion, the embodiment of the present application provides a micro light emitting diode display panel, including a substrate, a first metal layer, a passivation layer and a second metal layer; a first metal layer, being positioned on the substrate and including a source electrode, a drain electrode and a power line; a passivation layer, being positioned on the first metal layer and including a first via hole on the source electrode and a second via hole on the power line; and a second metal layer, being positioned on the passivation layer and including a first bonding electrode and a second bonding electrode, and the first bonding electrode is electrically connected to the source electrode through the first via hole, and the second bonding electrode is electrically connected to the power line through the second via hole; wherein the first via hole and the second via hole are both provided with a supporting column. In the present application, the first via hole and the second via hole are arranged in the passivation layer, and then the supporting columns are arranged in the first via hole and the second via hole, and then the first bonding electrode and the second bonding electrode are arranged on the supporting columns. The heights of the first bonding electrode and the second bonding electrode are increased by the supporting columns. When the transferring process is performed, the transferring machine only contacts the anisotropic conductive adhesive films on the first bonding electrode and the second bonding electrode to avoid thermal pressing short circuit in other positions in the plane, thereby improving the transferring yield of the micro light emitting diode chips. The present application solves the technical issue that due to the in-plane low position of the bonding electrode of the micro light emitting diode chip in the micro light emitting diode display panel of the prior art, it is easy to cause a short circuit of the bonding electrode and the in-plane wiring, and to cause the poor ACF conductivity during the transferring process to affect product yield.

In the foregoing embodiments, the description of the various embodiments have respective different emphases, and a part in some embodiment, which is not described in detail can be referred to the related description of other embodiments.

It will be appreciated that those of ordinary skill in the art, or can be changed according to the technical equivalents of the present application and its inventive concept, and all such substitutions or modifications of the present application should belong to the appended claims protected range.

What is claimed is:

1. A micro light emitting diode display panel, comprising:
a substrate;
a first metal layer, being positioned on the substrate and including a source electrode, a drain electrode and a power line;
a passivation layer, being positioned on the first metal layer and comprising a first via hole on the source electrode and a second via hole on the power line; and
a second metal layer, being positioned on the passivation layer and comprising a first bonding electrode and a second bonding electrode, and the first bonding electrode is electrically connected to the source electrode through the first via hole, and the second bonding electrode is electrically connected to the power line through the second via hole;

wherein the first via hole and the second via hole are both provided with a supporting column.

2. The micro light emitting diode display panel according to claim 1, wherein the micro light emitting diode display panel further includes a micro light emitting diode chip, and the micro light emitting diode chip is electrically connected to the first bonding electrode and the second bonding electrode through an anisotropic conductive adhesive film, respectively.

3. The micro light emitting diode display panel according to claim 2, wherein heights of the supporting columns are greater than or equal to 3 micrometers and less than or equal to 10 micrometers.

4. The micro light emitting diode display panel according to claim 3, wherein the heights of the supporting columns are equal.

5. The micro light emitting diode display panel according to claim 2, wherein a material of the supporting columns is an organic photoresist material.

6. The micro light emitting diode display panel according to claim 2, wherein cross-sectional shapes of the supporting columns are rectangular or circular.

7. The micro light emitting diode display panel according to claim 2, wherein longitudinal cross-sectional shapes of the supporting columns are rectangular or trapezoidal.

8. The micro light emitting diode display panel according to claim 2, wherein the two supporting columns positioned in the first via hole and the second via hole, which are adjacent, constitute a support portion, and the support portions are distributed at equal intervals.

9. The micro light emitting diode display panel according to claim 2, wherein a thickness of the micro light emitting diode chip is greater than or equal to 4 micrometers and less than or equal to 8 micrometers.

10. The micro light emitting diode display panel according to claim 9, wherein a thickness of the anisotropic conductive adhesive film is greater than or equal to 4 micrometers and less than or equal to 8 micrometers.

11. The micro light emitting diode display panel according to claim 10, wherein the thickness of the anisotropic conductive adhesive film is equal to the thickness of the micro light emitting diode chip.

12. A manufacturing method of a micro light emitting diode display panel, comprising:
providing a substrate;
preparing and patterning a first metal layer on the substrate to form a source electrode, a drain electrode and a power line;
preparing and etching a passivation layer on the first metal layer to form a first via hole and a second via hole, and the first via hole is positioned on the source electrode and the second via hole is positioned on the power line;
preparing a supporting column in the first via hole and a supporting column in the second via hole; and
preparing and patterning a second metal layer on the passivation layer to form a first bonding electrode and a second bonding electrode, and the first bonding electrode is electrically connected to the source electrode through the first via hole, and the second bonding electrode is electrically connected to the power line through the second via hole.

13. The manufacturing method of the micro light emitting diode display panel according to claim 12, wherein the manufacturing method further includes steps of:
bonding a micro light emitting diode chip on the second metal layer, and the micro light emitting diode chip is electrically connected to the first bonding electrode and the second bonding electrode through an anisotropic conductive adhesive film, respectively.

14. The manufacturing method of the micro light emitting diode display panel according to claim 13, wherein heights of the supporting columns are greater than or equal to 3 micrometers and less than or equal to 10 micrometers.

15. The manufacturing method of the micro light emitting diode display panel according to claim 13, wherein a material of the supporting columns is an organic photoresist material.

16. A display device, comprising a micro light emitting diode display panel and a cover plate, wherein the micro light emitting diode display panel includes:
a substrate;
a first metal layer, being positioned on the substrate and comprising a source electrode, a drain electrode and a power line;
a passivation layer, being positioned on the first metal layer and comprising a first via hole on the source electrode and a second via hole on the power line; and
a second metal layer, being positioned on the passivation layer and comprising a first bonding electrode and a second bonding electrode, and the first bonding electrode is electrically connected to the source electrode through the first via hole, and the second bonding electrode is electrically connected to the power line through the second via hole;
wherein the first via hole and the second via hole are both provided with a supporting column.

17. The display device according to claim 16, wherein the micro light emitting diode display panel further includes a micro light emitting diode chip, and the micro light emitting diode chip is electrically connected to the first bonding electrode and the second bonding electrode through an anisotropic conductive adhesive film, respectively.

18. The display device according to claim 17, wherein cross-sectional shapes of the supporting columns are rectangular or circular.

19. The display device according to claim 17, wherein longitudinal cross-sectional shapes of the supporting columns are rectangular or trapezoidal.

20. The display device according to claim 17, wherein the two supporting columns positioned in the first via hole and the second via hole, which are adjacent, constitute a support portion, and the support portions are distributed at equal intervals.

* * * * *